United States Patent
Fong et al.

(10) Patent No.: US 7,301,795 B2
(45) Date of Patent: Nov. 27, 2007

(54) ACCELERATED LOW POWER FATIGUE TESTING OF FRAM

(75) Inventors: John Y. Fong, Allen, TX (US); Anand Seshadri, Plano, TX (US); Sung-Wei Lin, Plano, TX (US); Sudhir Kumar Madan, Richardson, TX (US); Jarrod Eliason, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 89 days.

(21) Appl. No.: 11/260,987

(22) Filed: Oct. 28, 2005

(65) Prior Publication Data

US 2006/0107095 A1 May 18, 2006

Related U.S. Application Data

(60) Provisional application No. 60/623,116, filed on Oct. 28, 2004.

(51) Int. Cl.
*G11C 11/22* (2006.01)
(52) U.S. Cl. .................. 365/145; 365/189.04; 365/190
(58) Field of Classification Search ................ 365/145, 365/189.04, 190, 117, 109, 148, 149, 189.07, 365/230.05
See application file for complete search history.

(56) References Cited

U.S. PATENT DOCUMENTS

| | | | |
|---|---|---|---|
| 5,373,463 A | 12/1994 | Jones Jr. | |
| 5,949,731 A | 9/1999 | Tsukude | |
| 6,038,162 A | 3/2000 | Takata et al. | |
| 6,314,018 B1 | 11/2001 | Pöchmüller | |
| 6,735,106 B2 | 5/2004 | Rickes et al. | |
| 7,200,028 B2 * | 4/2007 | Yamamura | 365/145 |
| 2004/0208041 A1 * | 10/2004 | Maruyama | 365/117 |

* cited by examiner

*Primary Examiner*—Richard T. Elms
*Assistant Examiner*—Dang Nguyen
(74) *Attorney, Agent, or Firm*—Jacqueline J. Garner; W. James Brady, III; Frederick J. Telecky, Jr.

(57) ABSTRACT

Systems and methods fatigue a ferroelectric memory device. Within a single cycle, a group of selected ferroelectric memory cells is fatigued by reading a first logical value from the cells while also writing a second logical value to the memory cells. The first logical value is temporarily stored into latches of sense amplifiers associated with the selected memory cells in order to decipher logical values. Subsequently, the first logical value is written back to the ferroelectric memory cells and a cycle of the fatigue operation is ended.

42 Claims, 9 Drawing Sheets

US 7,301,795 B2

ACCELERATED LOW POWER FATIGUE TESTING OF FRAM

RELATED APPLICATIONS

This application claims the priority of U.S. Provisional Application Ser. No. 60/623,116, filed Oct. 28, 2004, entitled FATIGUE TESTING OF FERROELECTRIC MEMORY.

FIELD OF INVENTION

The present invention relates generally to ferroelectric memory devices and, more particularly, to systems and methods that perform fatigue testing of ferroelectric memory.

BACKGROUND OF THE INVENTION

Memory devices, whether they are volatile or non volatile, operate by storing, maintaining, and providing data. Of course, it is expected that memory devices should perform their duties reliably in that provided data should be the same data that was originally stored. However, over time, individual cells in memory devices can lose their ability to reliably store, maintain, and provide data. As a result, manufacturers often test their memory devices over a simulated lifetime in order to determine whether their memory devices provide an adequate life expectancy.

One non-volatile memory device in particular is a ferroelectric memory device, also referred to as ferroelectric random access memory (FeRAM). A ferroelectric memory device generally includes an array of memory cells where each memory cell contains at least one ferroelectric capacitor. The ferroelectric capacitor contains a ferroelectric material sandwiched between conductive plates. To store a data bit in a ferroelectric memory cell, a write operation applies write voltages to the plates of the ferroelectric capacitor in the ferroelectric memory cell to polarize the ferroelectric material in a direction associated with the data bit being written. A persistent polarization remains in the ferroelectric material after the write voltages are removed and thus provides non-volatile storage of the stored data bit.

A conventional read operation for a ferroelectric memory device determines the data bit stored in a ferroelectric memory device cell by connecting one plate of a ferroelectric capacitor to a bit line and raising the other plate to a read voltage. If the persistent polarization in the ferroelectric capacitor is in a direction corresponding to the read voltage, the read voltage causes a relatively small current through the ferroelectric capacitor, resulting in a small charge and voltage change on the bit line. If the persistent polarization initially opposes the read voltage, the read voltage flips the direction of the persistent polarization, discharging the plates and resulting in a relatively large charge and voltage increase on the bit line. A sense amplifier can determine the stored value from the resulting bit line charge or voltage.

Repeated reading and writing of a ferroelectric memory cell, which changes the polarization state of the ferroelectric capacitor, can fatigue the ferroelectric material and alter the properties of the ferroelectric memory cell. The resulting fatigue may eventually lead to a failure in that the ferroelectric memory cell is unable to maintain/store values. One mechanism employed to predict when a particular ferroelectric memory cell may fail is to measure the properties on the ferroelectric memory cell before and after performing a series of read and write operations on the ferroelectric memory cell. A measured change in the properties of the ferroelectric memory cell can then be extrapolated to the desired minimum life of the ferroelectric memory cell to project whether the ferroelectric memory cell will still be operable. If the extrapolation indicates that the ferroelectric memory cell will fail before reaching the desired minimum life, the ferroelectric memory cell may have a latent defect and may be replaced with redundant ferroelectric memory cells in a memory device.

The number of read or write cycles expected before a failure of a ferroelectric memory cell is relatively large (e.g., on the order of 10E15 cycles or more) in order to provide a memory device with a commercially viable life. The large number of cycles before failure can make fatigue testing time consuming. Thus, suitable life cycle testing could require about 10E12 to about 10E15 read/write cycles in order to simulate a lifetime of a ferroelectric memory cell. However, performing 10E12 read and write operations on every memory cell in a reasonable size ferroelectric memory device (e.g., in a 6-megabit ferroelectric memory device) would require days, weeks, or even months, making such testing impractical for production testing of ferroelectric memory device and at least bothersome when testing a ferroelectric memory device design. Extrapolation, which estimates a desired lifetime based on a shorter number of actual performed cycles, can be employed but can reduce the accuracy and/or reliability of the lifetime testing.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides systems and methods of fatiguing ferroelectric memory devices with reduced power and time. These systems and methods can be employed to perform lifetime testing of ferroelectric memory devices. Lifetime testing involves performing reads and consecutive writes of alternating data to memory cells for a number of cycles estimated to represent an approximate number of expected write cycles that a device will undergo in a specified lifetime. Additionally, lifetime testing also should be performed on an adequate sampling of memory cells present within a ferroelectric memory device to properly characterize a device.

As an example, according to one estimation of a ten year lifetime of a ferroelectric memory device, ferroelectric memory cells typically undergo 10E15 cycles wherein a first logical value (e.g., "1" or "0") is read, a second logical value (e.g., "0" or "1") is written, and the first logical value is written back.

The present invention facilitates lifetime testing of ferroelectric memory devices by permitting lifetime testing at a faster speed (in less time), over more memory cells, and with less power than typical conventional methods and systems. The relatively low power consumption permits fatiguing of relatively large numbers of ferroelectric memory cells at a time (e.g., 1024 ferroelectric memory cells).

The above can be accomplished by employing methods and systems wherein as one logical value is being read, another logical value is being written. Subsequently, the first read value is written back to the memory cells thereby completing a cycle of testing and a current fatigue cycle is ended. The fatigue operation can then be repeated a suitable number of times to gage lifetime performance of ferroelectric memory devices.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
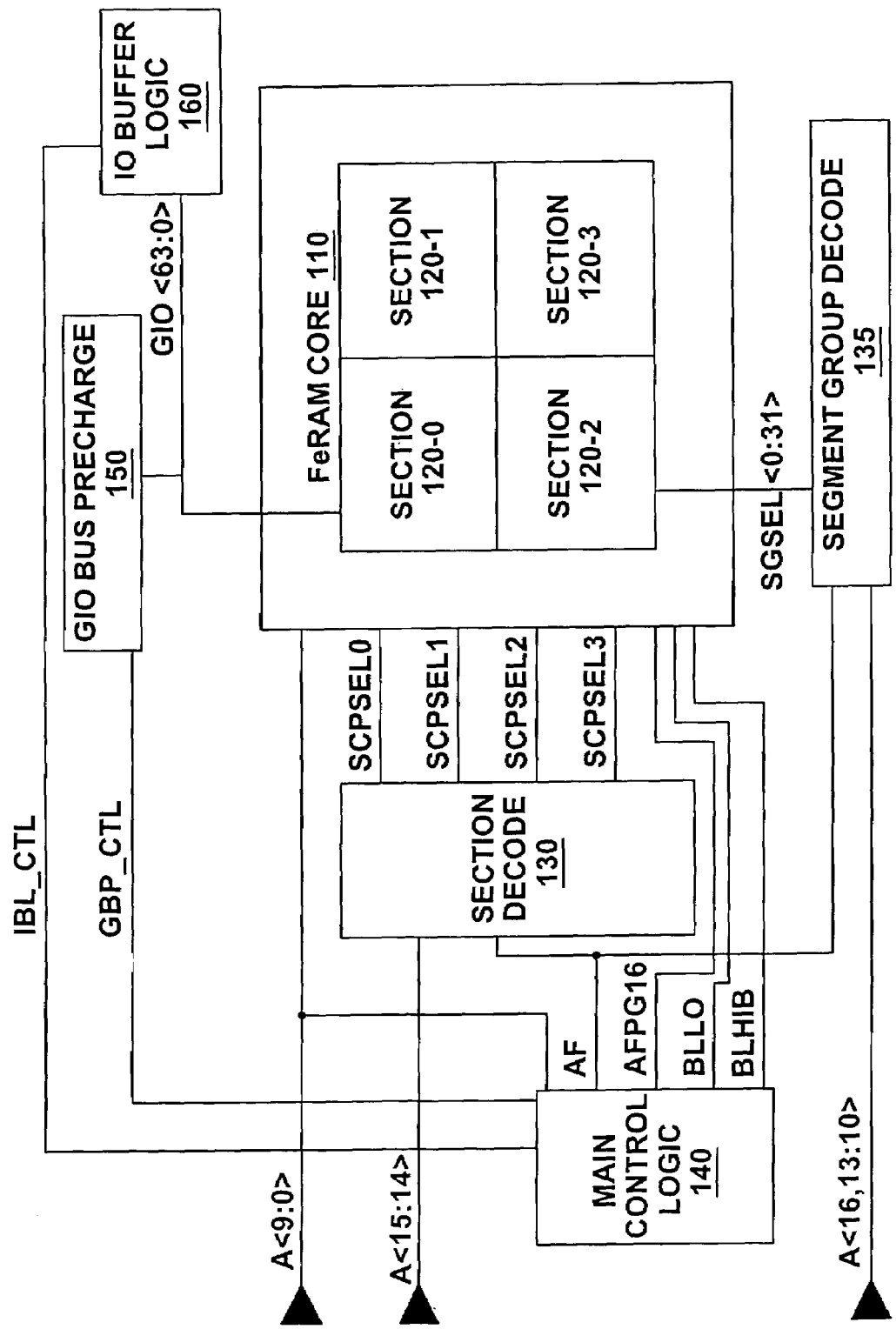
FIG. 1 is a block diagram of an exemplary ferroelectric memory device in accordance with an aspect of the present invention.

One or more implementations of the present invention will now be described with reference to the attached drawings, wherein like reference numerals are used to refer to like elements throughout, and wherein the illustrated structures are not necessarily drawn to scale.

The present invention provides systems and methods of fatiguing ferroelectric memory devices. These systems and methods can be employed to perform simulated lifetime testing of ferroelectric memory devices. Lifetime testing involves performing consecutive writes of alternating data to memory cells for a number of cycles estimated to represent an approximate number of expected write cycles that a device will undergo in a specified lifetime. Additionally, the lifetime testing also should be performed on an adequate sampling of memory cells present within a ferroelectric memory device.

As an example, according to one estimation of a ten year lifetime of a ferroelectric memory device, ferroelectric memory cells typically undergo 10E15 cycles wherein a first logical value (e.g., "1" or "0") is read, a second logical value (e.g., "0" or "1") is written, and the first logical value is written back.

The present invention facilitates lifetime testing of ferroelectric memory devices by permitting lifetime testing at a faster speed (in less time), over more memory cells, and with less power than typical prior art methods and systems. This is accomplished by employing methods and systems wherein as one logical value is being read, another logical value is being written to selected ferroelectric memory cells. Afterward, the read value is written back to the selected ferroelectric memory cells and the current fatigue cycle is ended. The fatigue cycle can then be repeated a desired number of times to test for lifetime reliability.

FIG. 1 is a block diagram of an exemplary ferroelectric memory device 100 in accordance with an aspect of the present invention. FIG. 1 depicts an exemplary memory device in which the present invention can be implemented. It is appreciated that the present invention can be incorporated into other ferroelectric memory devices having different components, different configurations, and different storage capacities.

The device 100 includes a ferroelectric random access memory (FeRAM) core 110, decoding circuits 130 and 135, main control logic 140, a pre-charge circuit 150, and I/O buffers 160. The FeRAM core 110 contains ferroelectric memory cells arranged in sections 120-0 to 120-3, in this example. The ferroelectric memory cells are for storing and providing data. The decoding circuits 130 and 135 decode or interpret an address signal for read, write, and accelerated fatigue operations accessing specific ferroelectric memory cells in the FeRAM core 110. Main control logic 140 controls operation of the device 100 including the read operations, write operations, and accelerated fatigue operations. Global input output (GIO) pre-charge circuit 150 and I/O buffers 160 work in cooperation to input data signals for writing to the FeRAM core 110 and to output data signals read from the FeRAM core 110.

The FeRAM core 110, which contains ferroelectric cells, which in this example, includes 4 sections 120-0 to 120-3, As stated above, it is appreciated that the size, arrangement, and number of sections in device 100 are merely exemplary and are provided to further illustrate the present invention. Other configurations and memory capacity can also be employed in accordance with the present invention.

For an access to a ferroelectric cell in the FeRAM core 110, section decoder 130 decodes two address bits and activates one of the four select signals SCPSEL0, SCPSEL1, SCPSEL2, and SCPSEL3 to select a section containing the memory cells selected for access. Each section 120-0 to 120-3 contains 32 segments, and segment group decoder 135 decodes five address bits to activate one of segment select signals SGSEL0 to SGSEL31, thereby selecting one segment from the selected section.

During fatigue testing, the main control logic 140 controls operations in order to perform fatigue testing of groups of memory cells, such as one or more segments, one or more sections, individual memory cells, and the like. Further details and descriptions of how the operations for testing the groups of memory cells are provided below.

Figure 2:
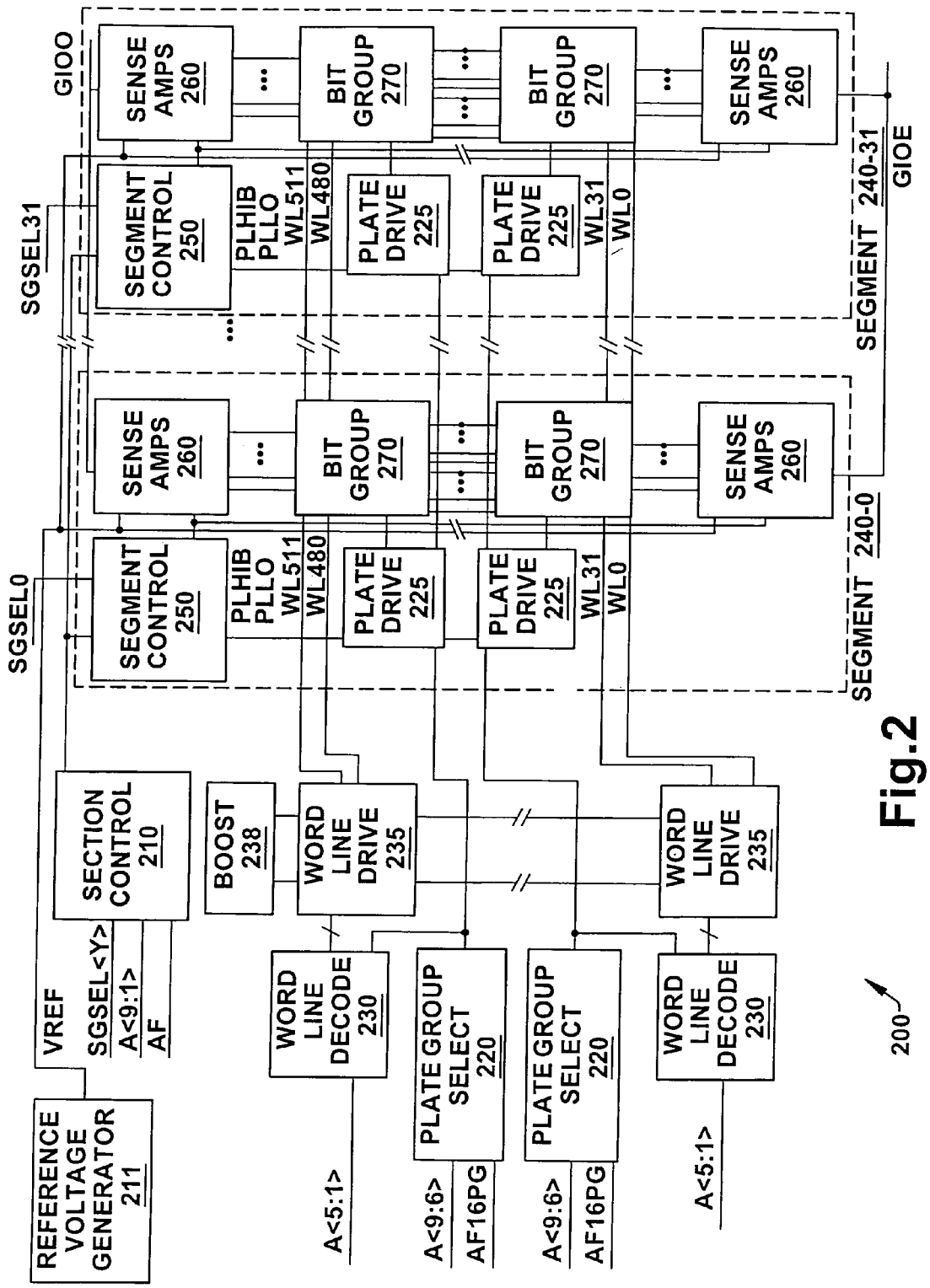
FIG. 2 is a block diagram of an exemplary section of memory core of FIG. 1 in accordance with an aspect of the invention.

FIG. 2 is a block diagram of an exemplary section 120 of memory core 110 of FIG. 1 in accordance with an aspect of the invention. In the exemplary embodiment, each section 120 includes 512 word lines WL0 to WL511, which are continuous across the 32 segments in the section 120. Each section 120 of memory core 110 further includes section control logic 210, plate group select logic 220, word line decode and drive circuits 230 and 235, and 32 segments 240-0 to 240-31. Each segment 240 includes sixty-four columns. Each column contains a pair of complimentary bit lines, Each segment also includes segment control logic 250, sixty-four sense amplifiers 260, and 16 plate line groups Each plate line group or plate group contains bit groups 270 from each column. The sense amplifiers 260 have the ability to concurrently latch read data while also driving data into read memory cells. Further details on suitable sense amplifiers that can be employed are provided infra. Each bit group 270 includes a set of 32 ferroelectric memory cells that have a common plate line, and associated plate drive circuits 225 control plate line voltages PL<0:15> of the respective bit groups 270.

A typical read or write operation in the ferroelectric memory device 100, in this example, accesses 64 ferroelectric memory cells at a time, in this exemplary configuration. Ferroelectric memory cell selection for a normal access includes activating a selected word line of word lines WL0 to WL511, connecting a selected segment 240 to the global I/O bus, and simultaneously activating only the plate line that is in the selected segment 240 and corresponds to the selected word line. Word line activation includes section decoder 130 activating one of the section signals SCPSEL0 to SCPSEL3 to select a section 120. Plate group select logic 220 in the selected sections 120 determines from address signals A<9:6> which bit groups 270 correspond to the row address of the selected memory cells, and the word line decoder 230 activated by plate group select logic 220 decodes address signals A<5:1> to cause the associated word line drive circuit 235 to activate the selected word line. Only the plate line drive circuit 225 that both plate group select logic 220 and segment group decoder 135 select activates its corresponding plate line.

A fatigue operation of in the ferroelectric memory device 100 can access many more than 64 ferroelectric memory cells at a time, in this exemplary configuration. Ferroelectric memory cell selection includes activating one or more selected word lines, connecting selected segments to the global I/O bus, and simultaneously activating plate lines for the selected segments. The relatively low power consumption of the fatigue operation permits accessing such a large number of memory cells at a time.

Figure 3:
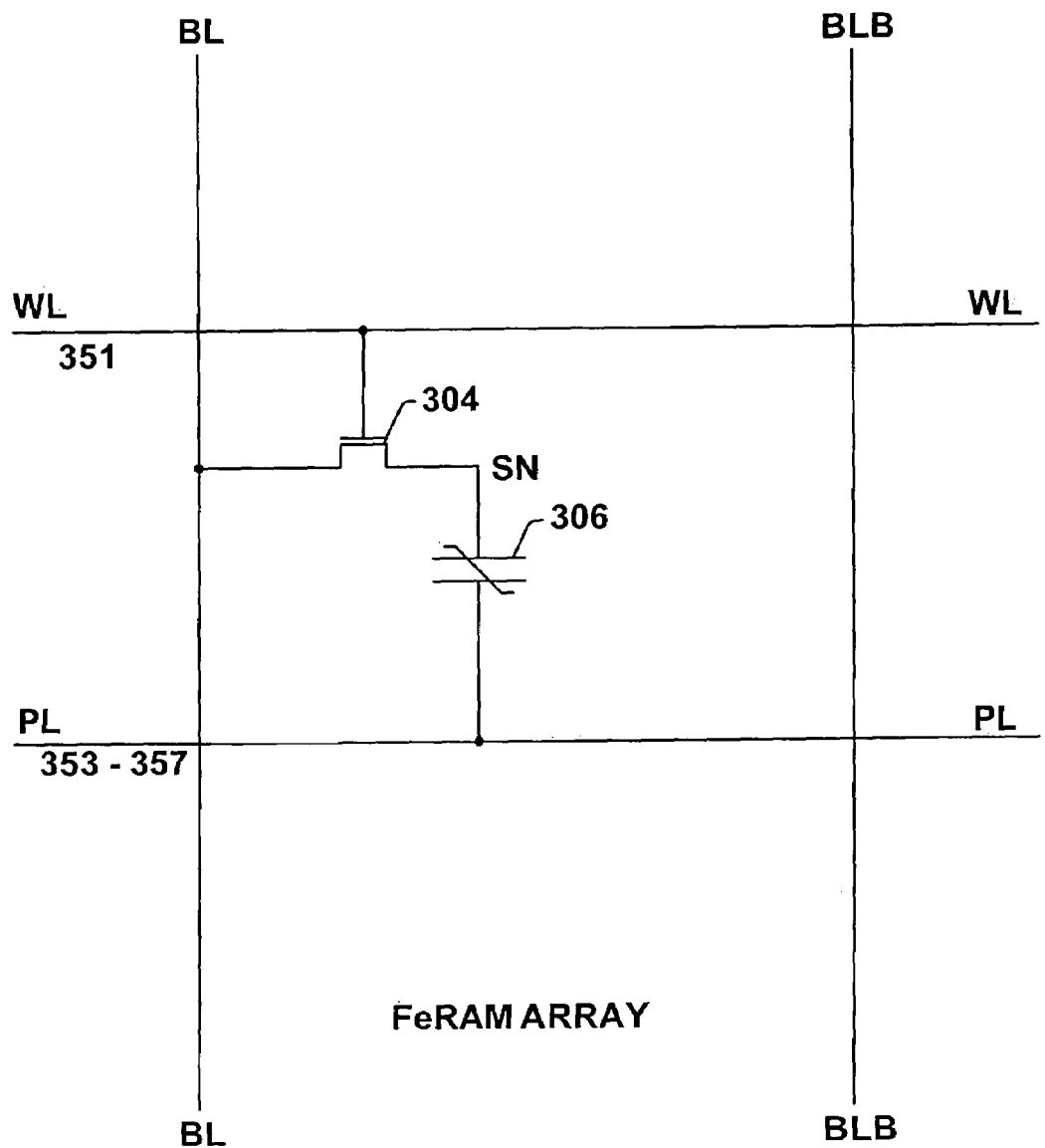
FIG. 3 is a schematic diagram illustrating an exemplary selected ferroelectric memory cell in accordance with an aspect of the present invention.

FIG. 3 is a schematic diagram illustrating an exemplary selected ferroelectric memory cell 302 in accordance with an aspect of the present invention. The cell 302 is described with respect to normal read/write operations in FIG. 5 and with respect to fatigue operations in FIG. 7 to further illustrate the present invention.

The ferroelectric memory cell 302 includes a ferroelectric capacitor 306 comprised of one or more ferroelectric materials, which are characterized by a reversible polarization in the absence of an electric field. When an alternating electric field is applied across the ferroelectric capacitor 306, the polarization shows a hysteretic behavior with the applied field. Once the electric field is removed, the ferroelectric material of the capacitor turns to a remnant polarization.

At zero applied field, there are two states of polarization, referred to as a positive polarization/state and a negative polarization/state. The actual amount/value of the polarization can vary according to factors such as device size, ferroelectric materials employed, and the like. Furthermore, these two states of polarization are equally stable. Either of these two states can be encoded as a "1" or a "0" and, since no external field is required to maintain these states, the ferroelectric memory cell 302 is nonvolatile. To switch the state of the cell 302, a threshold field greater than +/− a program voltage also known as coercive voltage is required. If a voltage is applied to a ferroelectric capacitor 306 is in a direction opposite of the previous voltage, the polarization switches, requiring compensating charge to flow onto the capacitor 306 plates. If the field is applied in the direction of the previously applied field (for writing), no switching takes place and a compensating charge is not required. This property is used to read the state or write a desired state into the capacitor.

The memory cell 302 is read destructively by sensing the charge that is delivered to the bitline when an external voltage is applied to the cell capacitor 306. For example, if the memory cell capacitor 302 is in a negative state and a positive plate voltage is applied from an initially ground voltage, there will be a relatively large charge or voltage sensed by the sense amplifier and other associated circuitry that indicates that the cell 302 was in the negative state. If the memory cell 302 is in a positive state and a positive plate voltage is applied from an initially ground voltage, there will be a relatively small charge or voltage sensed by a sense amplifier and other associated circuitry indicating that the cell 302 was in a positive state.

The ferroelectric memory cell 302 includes a select transistor 304 and the ferroelectric capacitor 306. A gate of the select transistor 304 is connected to a word line (WL), a drain of the select transistor 304 is connected to a bit line (BL), and a source is connected to a first plate of the ferroelectric capacitor 306. The first plate of the ferroelectric capacitor is also called a storage node (SN). A second plate of the ferroelectric capacitor 306 is connected to a plate line (PL), and is also referred to as a plate node. The select transistor 304 provides electrical isolation to the memory cell 302 thereby allowing selection of the memory cell 302 or other ferroelectric memory cells within a device by other circuitry. When selected for read/write operations, the word line (WL) is asserted high thereby coupling the BL to the first plate of the ferroelectric capacitor 306.

For a write operation, the WL is asserted high, the BL is driven to a write voltage (e.g., ground or Vdd), and a pulse is applied to the PL. The applied pulse is typically high with BL grounded in order to write a "0" value and is typically low with BL at Vdd in order to write a "1" value. A "0" would be written when the BL is low and PL is high and a "1" will be written when the BL is high and PL is low. So depending upon the BL value, at the end of PL pulse after PL has completed low to high and high to low transitions) a "0" or "1" is written. As a result, a state of the ferroelectric capacitor is altered reflecting the written value. It is contemplated that logical values corresponding to states of the ferroelectric capacitor 306 can be varied in accordance with the present invention.

For a read operation, the WL is asserted, the BL is pre-charged to the read voltage (e.g., ground) and made to float, and a read pulse is applied to the PL. Then, charge on the BL is measured by a sense amplifier, which indicates a read value of the memory cell 302. Reading the memory cell 302 is a destructive operation and requires that the read value be written back to the memory cell 302. To write back, depending on the read value, a low or high value is asserted on the BL by the sense-amp. For example, if a "0" is initially read, a low voltage value is asserted on the BL to write back a "0". Otherwise, if a "1" is initially read, a high voltage value is asserted on the BL in order to write back a "1". The data will be written back to the memory capacitor when the PL makes high to low transition while the BL is asserted.

Figure 4:
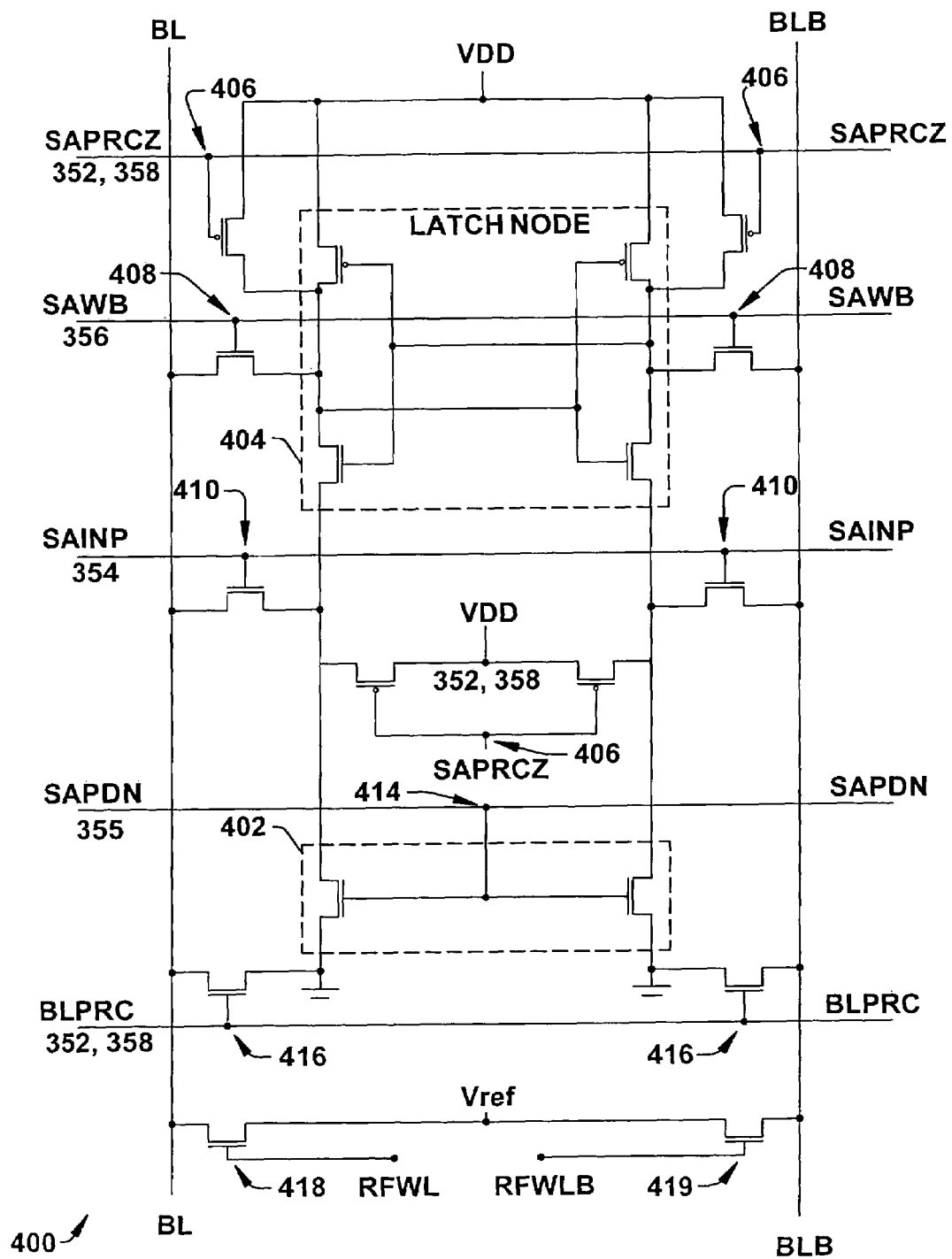
FIG. 4 is a schematic diagram of a latching sense amp in accordance with an aspect of the present invention.

FIG. 4 is a schematic diagram of a latching sense amp 400 in accordance with an aspect of the present invention. The sense amp 400 is operative to latch read data while concurrently driving a bit line (BL) to a zero value. The sense amp 400 is exemplary in nature and is provided as an example of a suitable sense amplifier in accordance with the present invention. It is appreciated that alternate sense amps with varied configurations and/or components can also be employed as long as they can, at least partly, latch data and concurrently drive/write data to a bit line.

The sense amp 400 includes a pulldown circuit 402 and a cross coupled latch 404. Additionally, the sense amp 400 is connected to BL and BLB as shown in FIG. 4. The sense amp 400 has a number of nodes configured to receive various signals and that activate or deactivate transistors according to the received signals. Sense amp pre-charge nodes 406 are operable to receive a sense amp pre-charge signal (SAPRCZ), sense amp write back nodes 408 are operable to receive a sense amp write back signal (SAWB) and can cause read data (charge) to be written back to the BL from the sense amp, sense amp input nodes 410 are operable to receive a sense amp input signal (SAINP) and allows information/data to travel into the sense amp 400 when asserted (e.g., asserted high), sense amp pull down nodes 414 are operable to receive the sense amp pull down signal (SAPDN) and facilitate identifying data values and writing strong zeros (described in later figures), and bit line pre-charge nodes 416 are operable to receive a bit line pre-charge signal (BLPRC).

The sense amp pulldown circuit 402 is activated when the SAPDN signal is asserted (high) and can operate to pull-down BL (bit line) and BLB (bit line bar) to ground when the SAPDN signal is asserted. It is noted that the sense amp pull down circuit 402 has a current source attached thereto that is split into two equal and separate currents sources, one that drives BL and another that drives BLB. The cross coupled latch 404 is operable to latch read data charge from memory cells on the SAINP signal being asserted high followed by the SAPDN signal being asserted high. The latch 404 temporarily stores the data that identify a logical value associated with it. It is noted that the cross coupled latch 404 can latch read data charge from the BL while the pulldown circuit 402 is also driving the BL to ground to create a strong zero for the memory to write into the cell capacitor.

Operation of the sense amp 400 is controlled by selectively asserting (e.g., turning from low to high) the above signals in order to read data from ferroelectric memory cells, to write data to ferroelectric memory cells, and to fatigue ferroelectric memory cells. To further illustrate the present invention, figures and methods are discussed below that illustrate mechanisms to read and write to ferroelectric memory cells employing the sense amp 400. However, it is noted that other sense amps and/or sets of signals can alternately be employed and still be in accordance with the present invention. One of the signals RFWL and RFWLB are asserted to couple the reference voltage, Vref to either BL or BLB. If the data is on BL, RFWLB is asserted and if the data is on BLB, RFWL is asserted during the sensing operation.

Figure 5:
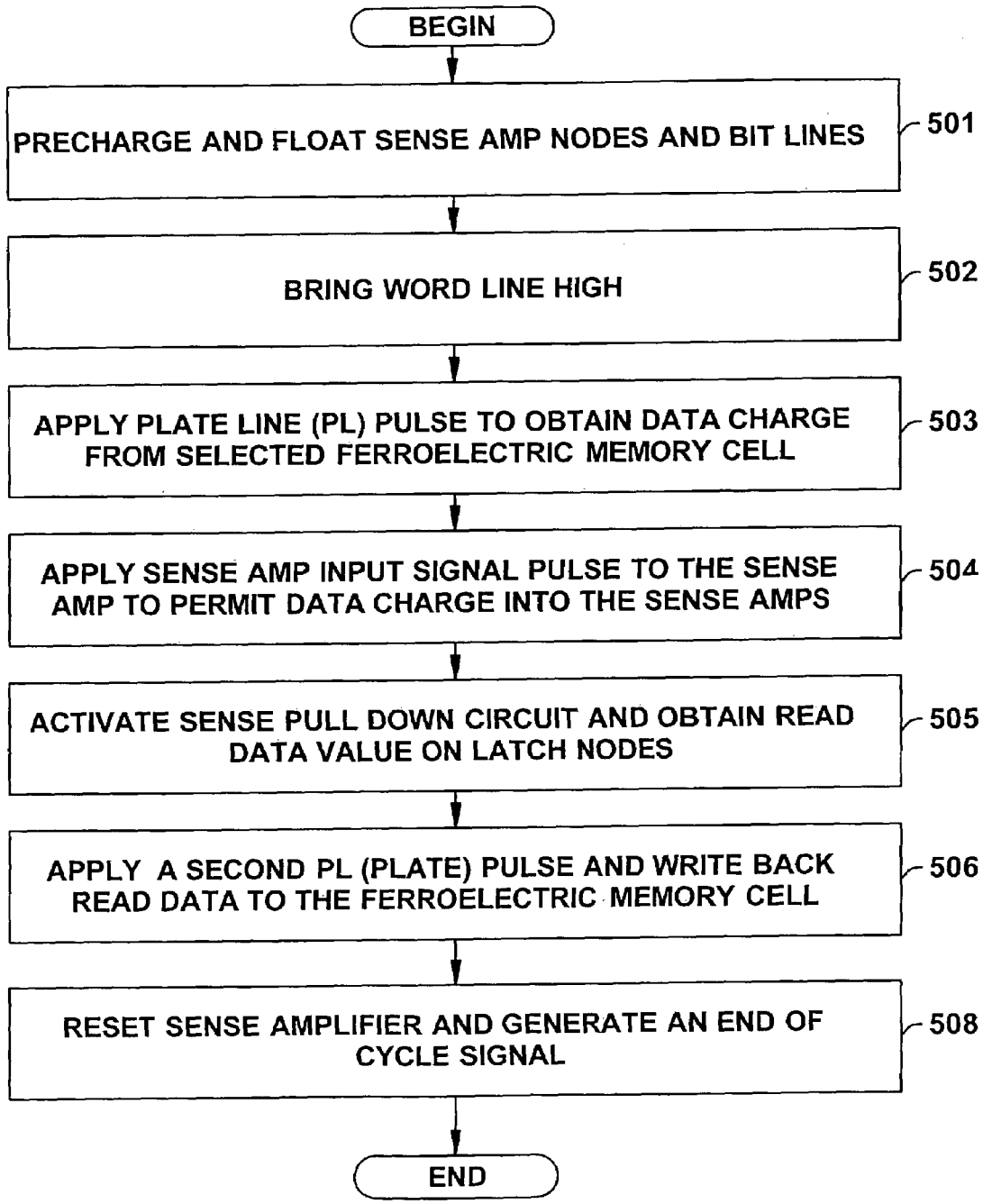
FIG. 5 is a flow diagram illustrating a method of reading a ferroelectric memory cell in accordance with an aspect of the present invention.

FIG. 5 is a flow diagram illustrating a method 500 of reading a ferroelectric memory cell in accordance with an aspect of the present invention. The method 500 is a destructive read operation that requires writing back read data in order to maintain the data in the ferroelectric memory cell. For a suitable configuration of the ferroelectric memory cell, refer to the memory cell 300 of FIG. 3. For a suitable configuration of a sense amplifier, refer to the sense amplifier 400 of FIG. 4. The method 500 can be performed by a memory controller such as the control logic 140 of FIG. 1.

The method 500 begins at block 501 wherein a several nodes of the sense amplifier are pre-charged to VDD and floated and also the bit line is pre-charged to VSS and floated. For the exemplary sense amp 400 of FIG. 4, the SAPRCZ signal is pre-charged/asserted (low) and the BLPRC signal is asserted (high). Next the SAPRCZ is asserted high and BLPRC is asserted low to float the sense-amp internal nodes and bit lines. A word line associated with the selected memory cell is asserted high at block 502, which selects the ferroelectric memory cell to be read and connects a storage node/plate of the ferroelectric capacitor to the bit line (e.g., connecting the ferroelectric capacitor 306 to the BL by the select transistor 304).

A plate line (PL) of the selected memory cell is pulsed (pulsed sensing) with a read plate pulse (low to high and then high to low) at block 503. The read plate pulse is applied to the plate node of the capacitor and dumps polarized data charge out of ferroelectric capacitors onto the bit line. A voltage reference, Vref, therefore, can be programmed onto bit line bar that is halfway between a "1" charge state voltage and a "0" charge state voltage on the bitline by asserting RFWLB.

Then, a sense amp input signal (SAINP) is pulsed for a duration thereby allowing data from the memory cell, via the dumped charge on the bit line, into the sense amp at block 504 in order to read data charge from the ferroelectric capacitor of the memory cell. For the sense amp 400 of FIG. 4, the SAINP signal is pulsed high thereby connecting the latch 404 and the pulldown circuit 402 to the bit line (BL and BLB) and allowing the cross coupled latch 404 to capture the data charge from the bit line. A sense amp pull down circuit, such as the pulldown circuit 402 of FIG. 4, is then activated causing latch nodes of the sense amp to separate at block 505 to VDD and VSS. Continuing at block 506, a sense amp write back signal is activated in order to write back the read and latched data. For FIG. 4, the SAWB signal is asserted high causing the value stored in the latch circuit 404 to be driven/written on the bit line and on to the ferroelectric memory cell.

As stated previously, a read operation of ferroelectric memory can be a destructive operation and typically requires writing back the read data. Otherwise, the state of the ferroelectric memory cell would/could be undeterminable. If a value of "0" was read, a "0" is written back to the ferroelectric memory cell by a high pulse voltage to the PL of the selected memory cell at block 506B. The high pulse causes the ferroelectric capacitor to revert to a state representing the "0". Alternately, if the read value is a "1", a "1," is written back to the ferroelectric memory cell when the PL voltage returns to a low value. Subsequently, the end of the cycle (EOC) is reached and sense amp pre-charge and bit line pre-charge signals are reasserted in order to reset the sense amp at block 508.

Figure 6:
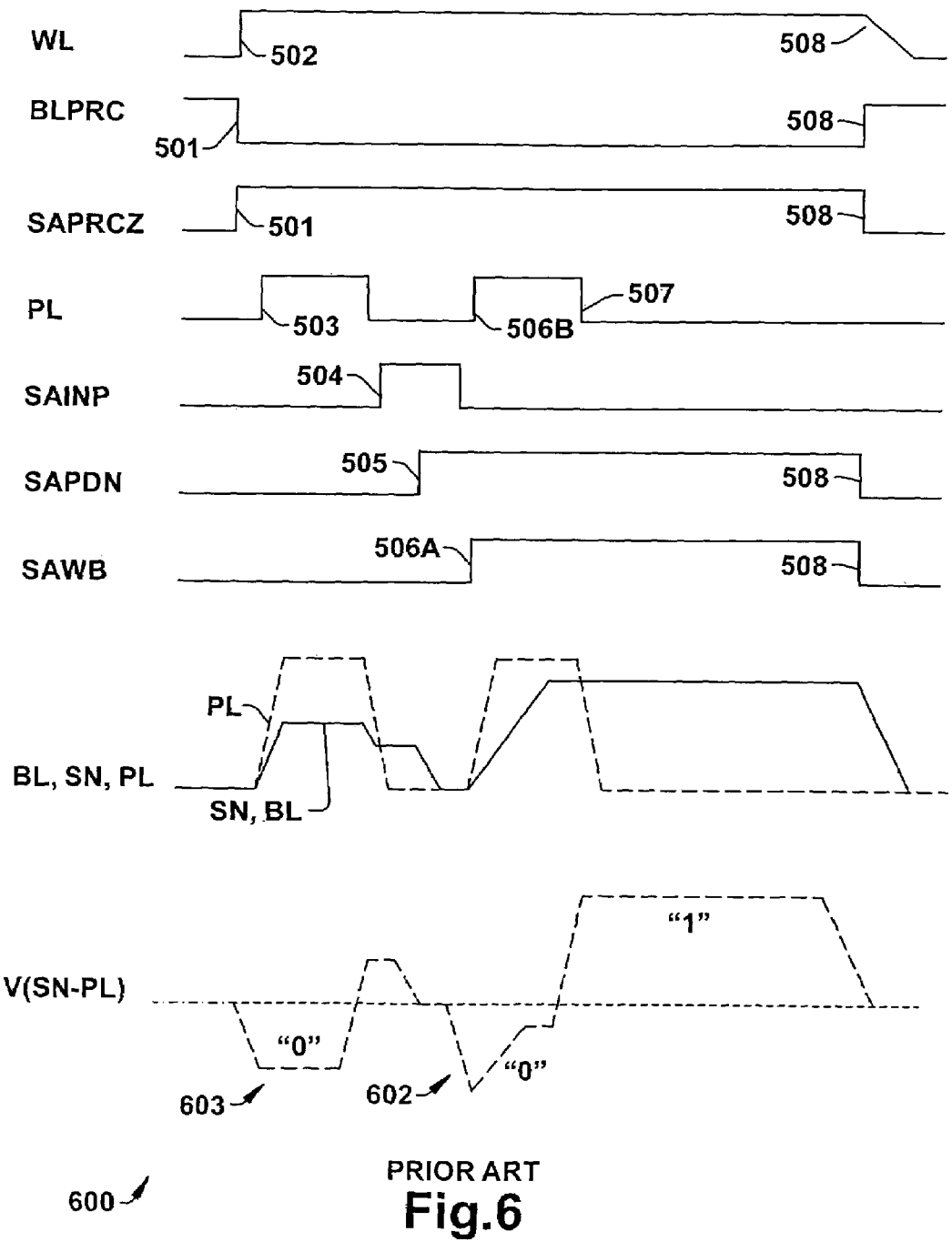
FIG. 6 is a timing diagram illustrating an exemplary read operation in accordance with an aspect of the present invention.

FIG. 6 is a timing diagram illustrating an exemplary read "1" operation 600 in accordance with an aspect of the present invention. Signals WL, BLPRC, SAPRCZ, PL, SAINP, SAPDN, SAWB, BL, and SN are shown over a single read cycle. The signals are provided to a selected ferroelectric memory cell and sense amp as described with respect to FIGS. 3 and 4. Corresponding method steps from the method 500 of FIG. 5 are indicated to further illustrate an exemplary read operation.

At 501, the SAPRCZ is asserted high and the BLPRC signal is asserted low. As indicated in FIG. 6, the WL signal is asserted high at 502 around the same time as 501 thereby selecting a ferroelectric memory cell. As a result, a ferroelectric capacitor of the selected cell is connected to a bit line. The PL signal, which is applied to a plate node of a ferroelectric capacitor, is pulsed high for a relatively short duration at 503 in order to read data charge from the memory cell. Subsequently, the SAINP is pulsed thereby allowing data from the memory cell, now on the bit line, into the sense amp at 504. The SAPDN signal is then asserted high at 505 causing the latch nodes to separate to VDD and VSS A SAWB signal is asserted ON or high at 506A and PL is pulsed at 506B, which causes the read data from the latch of the sense amp to be rewritten to the selected memory cell. At 508, the end of the read cycle is attained and the BLPRC is reasserted high, the SAPRCZ is deasserted low, and the SAWB signal is also deasserted thereby resetting the sense amplifier. Once the bitlines have been discharged to ground, the WL is deasserted low at time later than 508 or at time 508 but with reduced the ramp down rate for the WL signal so that the pass transistors are able couple SN's to BL's till the BL's discharge to ground. Alternatively the WL once asserted could be maintained in this state for subsequent cycles and not turned off at 508.

The voltage across the ferroelectric capacitor is equal to SN (measured voltage)—PL (plate line voltage). The inventors of the present invention notice that the largest voltage excursion for the "0" state, also referred to as a weak "0" and shown at 602 is significantly lower than the "1" write back voltage, also referred to as a strong "1". The desired largest voltage excursion for the "0" state should be at least 90% of the "1" write back voltage. A separate cycle can be employed to write a strong "0" that has a voltage excursion comparable to that of the strong "1", however an extra cycle increases time to perform read operations and increase the fatigue test time.

Figure 7:
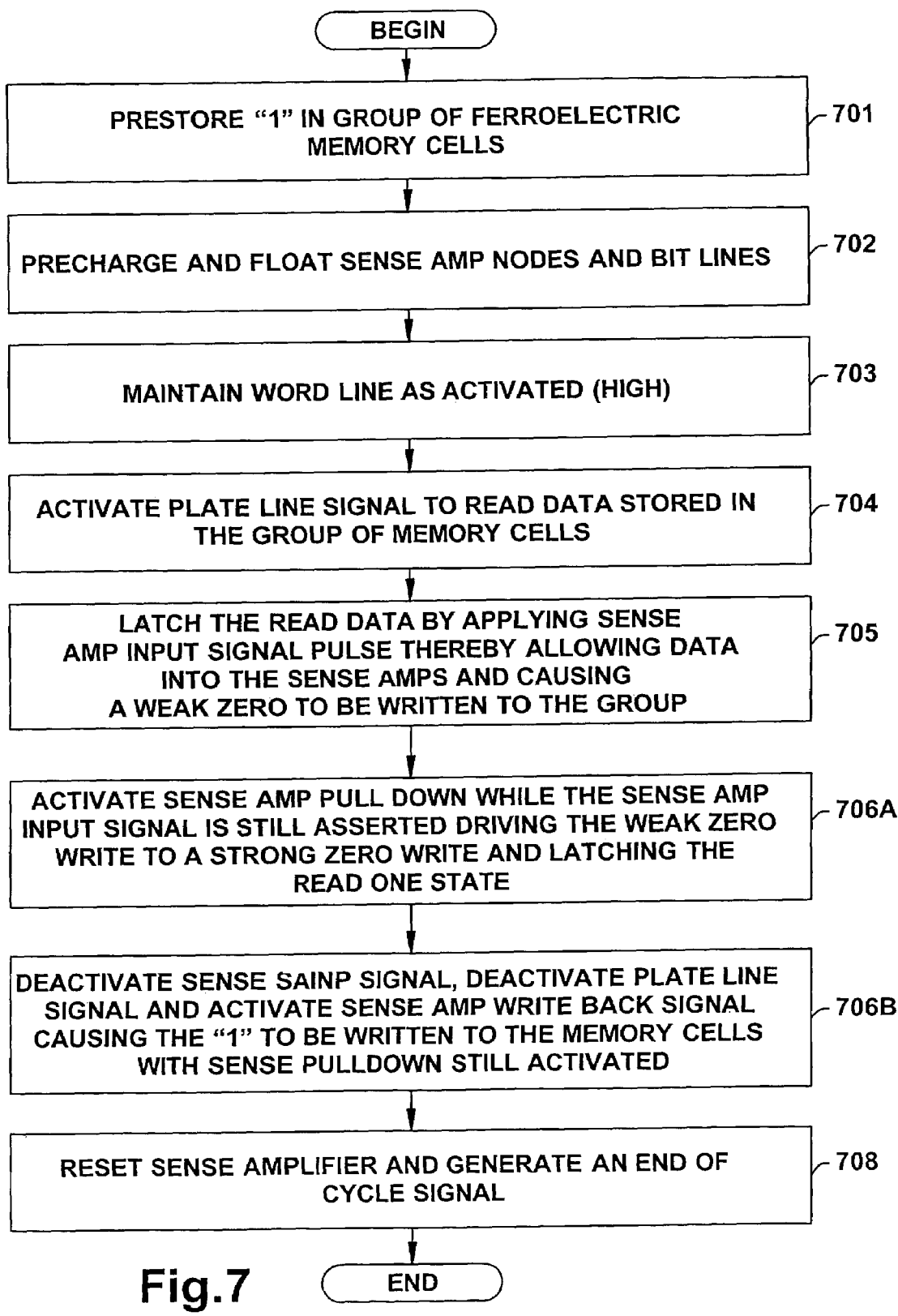
FIG. 7 is a method of fatiguing ferroelectric memory cells in accordance with an aspect of the present invention.

FIG. 7 is a method 700 of fatiguing ferroelectric memory cells in accordance with an aspect of the present invention. The method 700 typically operates on a relatively large group of ferroelectric memory cells at a time, such as one or two sections of memory cells within an array (e.g., 1024 or 2048 memory cells). For a suitable configuration of individual ferroelectric memory cells, refer to the memory cell 300 of FIG. 3. For a suitable configuration of a sense amplifier, refer to the sense amplifier 400 of FIG. 4. The method 700 can be performed by a memory controller such as the control logic 140 of FIG. 1 and can be repeated over a large number of cycles in order to simulate and test lifetime operation of the ferroelectric memory cells in parallel. It is noted that passes of the method, also referred to as cycles read "1" values from the cells and write "0" and "1" values thereby fatiguing and simultaneously permitting verifying of the written "1" values.

The method 700 begins at block 701 wherein "1" values are prestored/written into a group of ferroelectric memory cells. The group is typically a large number of memory cells and can be much greater than the number present in a single word (e.g., typically 16, 32, or 64 memory cells in a word) for conventional fatigue operations. For example, the group can comprise an entire section of a memory array, such as 1024 ferroelectric memory cells or it could be a few selected segments. The main control logic 140, section decode 130, segment group decode 135, GIO bus precharge, I/O buffer logic 160 etc. of FIG. 1 or variations there of can be modified to accomplish the implementation of the method 700. It is appreciated that subsequent iterations of the method do not require writing and/or prestoring "1" values into the memory cells because the method ultimately writes back the "1" value before ending.

Continuing with the method 700, at block 702 sense amplifier nodes and bit lines are pre-charged and then floated. For the sense amp 400 of FIG. 4, the SAPRCZ signal is asserted high and the BLPRC signal is asserted low and provided to the SAPRCZ nodes 406 and the BLPRC nodes 416, respectively. A word line associated with the selected memory cells is maintained as asserted (high) at block 703.

So doing keeps cells of the group selected and maintains connections of the associated ferroelectric capacitors to the bit line (e.g., connecting the ferroelectric capacitor 306 to the BL by the select transistor 304 of FIG. 3). It is noted that the word line is maintained instead of asserted and deasserted because the same group of cells is undergoing fatigue testing for a large number of cycles. As a result, power savings are attained by not repeatedly charging and discharging the word line.

One or more plate lines (PL) of the selected ferroelectric memory cells are pulsed (activated) with a relatively long pulse, also referred to as a relatively long read pulse, at block 704 in order to read data from the memory cell. The pulse is typically long enough to permit a strong "0" to be written back to the memory cell. Referring to the cell 300 of FIG. 3 as an example, the pulse is applied to the PL nodes shown in FIG. 3.

For a normal, typical read operation, the read (read plate) pulse high dumps polarized data charge out of ferroelectric capacitors along with some linear non-data charge associated with non-polarization component of the ferroelectric capacitor out of the ferroelectric capacitors. However, the method of 700 has "1" values prestored and therefore does not require knowing what data charge is being read out onto the bit line. The method 700 assumes that a "1" has been read. Thus, the voltage reference for the bit line bar is simply set to zero and the read pulse is not required to be ended or forced low. Thus, the sense amplifier can assume that any data charge dumped onto the bit line is larger than 0 volts and, hence, is a "1" value.

Subsequent to applying the relatively long read pulse at block 704, a sense amp input signal pulse is applied to the sense amp, during the read pulse, thereby allowing data from the memory cell into the sense amp at block 705 of FIG. 7 and at the same time driving a "0" into the memory cells. For the sense amp 400 of FIG. 4, the SAINP signal is pulsed and applied to the nodes 410 thereby connecting the latch 404 and the pulldown circuit 406 to the bit line (BL and BLB).

A sense amp pull down circuit of the sense amp, such as the pulldown circuit 402 of FIG. 4, is activated further and the cross coupled latch 404 is then operative to capture the read data. The sense amp pull down activation also drives the bitlines to ground resulting in a strong "0", onto the bit line(s) at block 706A. It is also noted that the sense amp pull down circuit is activated for a significant time period during the sense amp input signal (SAINP) being asserted facilitating writing back the strong "0". The pull down circuit is activated which allows to latch the "1" value read from the memory cells into a latch circuit of the sense amp and concurrently allows the pulldown circuit, while the sense amp input is still on, to pull the bit line(s) low and write a strong "0" into the memory cells that were just read. While the strong "0" is written into the memory cells by 0V on the bit line(s), the read "1" value is safely stored in the latch circuit.

Figure 8:
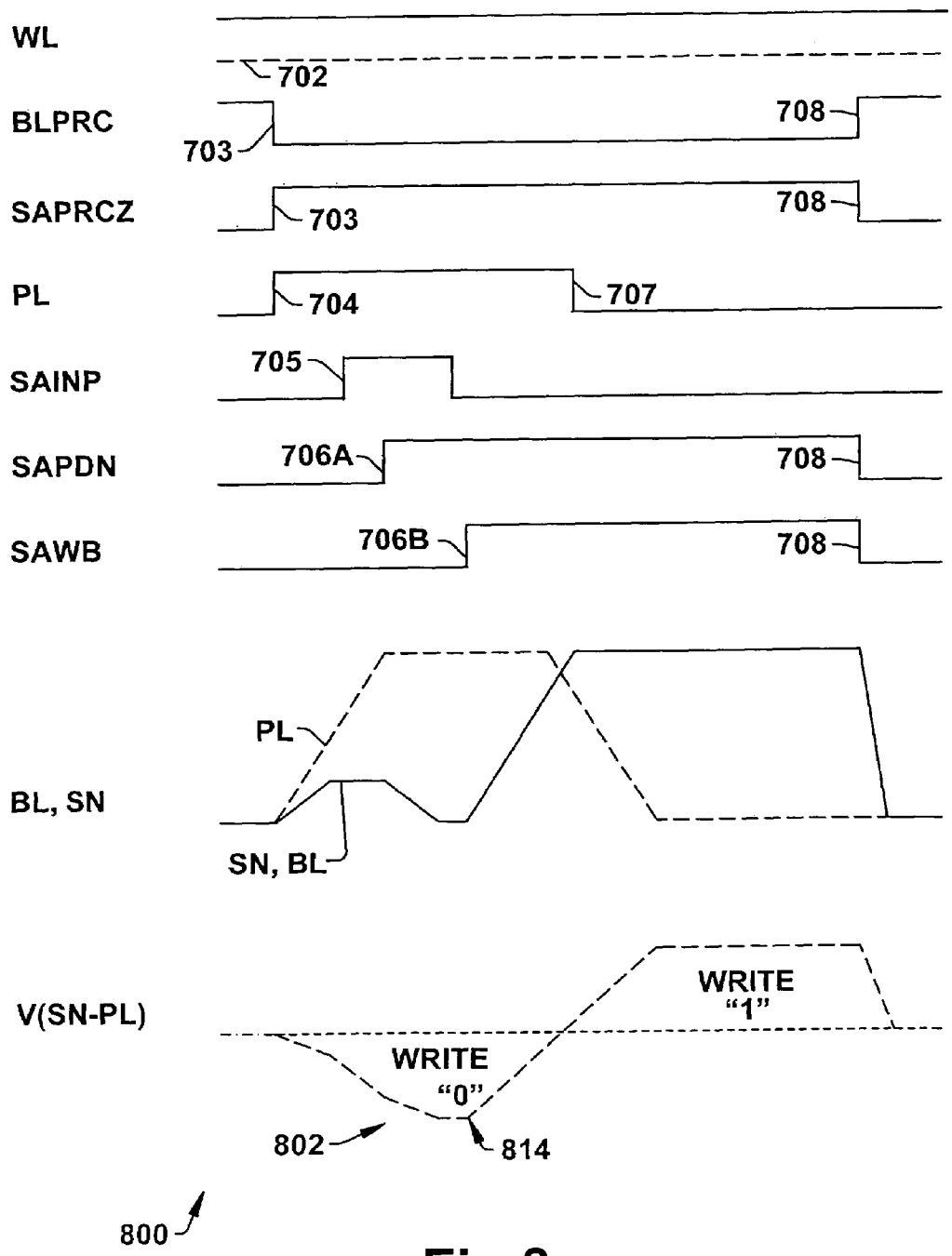
FIG. 8 is a timing diagram illustrating a fatigue cycle in accordance with an aspect of the present invention.

Continuing at block 706B, the sense amp input signal SAINP is deactivated prior to a sense amp write back signal being asserted (high) while the sense amp pull down circuit is still activated allowing a strong "1" to be written to the memory cells. The read "1" stored in the latch circuit is returned to the bit line(s). For FIG. 4, the SAWB signal is asserted causing the read "1" stored within the latch circuit 404 to be written on the bit line(s). The plate line pulse or read pulse high is ended at 707 (FIG. 8). Subsequently, the end of the cycle (EOC) is reached and sense amp pre-charge and bit line pre-charge signals are reasserted in order to reset the sense amp at block 708.

For purposes of simplicity of explanation, the methodology of FIG. 7 is depicted and described as executing serially. However, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 8 is a timing diagram illustrating a fatigue cycle 800 in accordance with an aspect of the present invention. Signals WL, BLPRC, SAPRCZ, PL (plate line), SAINP, SAPDN, SAWB, BL, and SN are shown over a single read cycle. The signals are provided to a group of selected ferroelectric memory cells and a sense amp, such as the exemplary memory cell and sense amp described with respect to FIGS. 3 and 4, respectively. Corresponding method steps from the method 700 of FIG. 7 are shown in the diagram of FIG. 8 to further illustrate the fatigue.

As described in the method 700, the group of memory cells are prestored with "1" values. Subsequent cycles of the method 700 are not required to prestore "1" values. The group typically comprises a large number of memory cells (e.g., 1024), but can also be a smaller number of memory cells (e.g., 64 bits).

At 702, the SAPRCZ is asserted high and the BLPRC signal is asserted low, which causes some of the sense amplifier nodes and bit lines to pre-charge and float. Instead of being asserted high, the WL signal is maintained high at 703 keeping the group of selected memory cells selected. In a first run through the method 700, the WL signal can be changed from low to high, but subsequent cycles do not require a change. As a result, charging and discharging of the word line is mitigating and can result in considerable power savings.

One or more plate lines of the selected memory cells receive a relatively long read pulse, the PL signal, at 704. The PL signal causes data charge to be transferred from the selected memory cells to one or more bit lines. Subsequently, the SAINP signal is pulsed high at 705 thereby allowing data from the memory cells into the sense amp. Additionally, a weak zero is formed on the capacitors of the selected memory cells as a result of the read pulse. The SAPDN signal is then brought or asserted high at 706A, which activates a sense amp pull down circuit in the sense amp and the latch nodes in the sense amp separates to the VDD and VSS and maintains the read data charge allowing the sense amp to decipher a logical value of the read data. The SAINP signal remains high for a portion of the SAPDN signal, which causes a strong zero to be written to the selected memory cells. As a result, the zero is being written to the selected ferroelectric memory cells as the "1" is being read. The flat region 814 in FIG. 8 for the V(SN-PL) plot 802 indicates that the PL is at it maximum and the BL is at 0V and this writes a strong "0" in the ferroelectric capacitor. A SAWB signal is asserted high or brought high at 706B, which causes the read data, the "1", on the bitlines of the selected memory cells and when the PL is returned to 0V at 707, data "1" is rewritten to the selected cells. The relative timings of 706B and 707 are not important in this example. The activation of the SAWB could be delayed until after the deactivation of PL. Finally, the end of cycle (EOC) is reached at 708 and the BLPRC is reasserted high, the SAPRCZ is de-asserted low, and the SAWB signal is also de-asserted, thereby resetting the sense amp. The prestore of cells with "1" as described can be avoided by setting the reference voltage so low that even a "0" from the cell is read as "1". Coupling of the BL's in the sense-amp as shown in the FIG. 4 to the bit lines of the memory cells shown in FIG. 3 may be through transfer gate (T-gate) transistors (not shown). Additionally the bit line restore circuit (not shown) could be attached to the memory cells bit lines (FIG. 3) which pulls the cell bit lines to full power supply value. Without the bit line restore circuit the BL may be restricted to VDD minus Vt for the case wherein the SAWB in FIG. 4 and or the T-gate transistors are n-ch. Alternatively, the voltage level for the SAWB and the T-gate when activated could be a voltage above VDD plus transistor threshold voltage so that full supply voltage, VDD, can couple through these gates.

In the exemplary method, the sense-amp pull down circuits captures the data into latches as well as pulls the bitlines to ground. Different type of sense-amp may or may not be able to pull down the bitlines to ground. Alternately, a pull down circuit external to the sense-amp could also be used to pulldown the bitlines to ground after the data has been sensed and or latched by the sense-amp. Activation of the BLPRC signal to pull down the bitline could be one such option.

Figure 9:
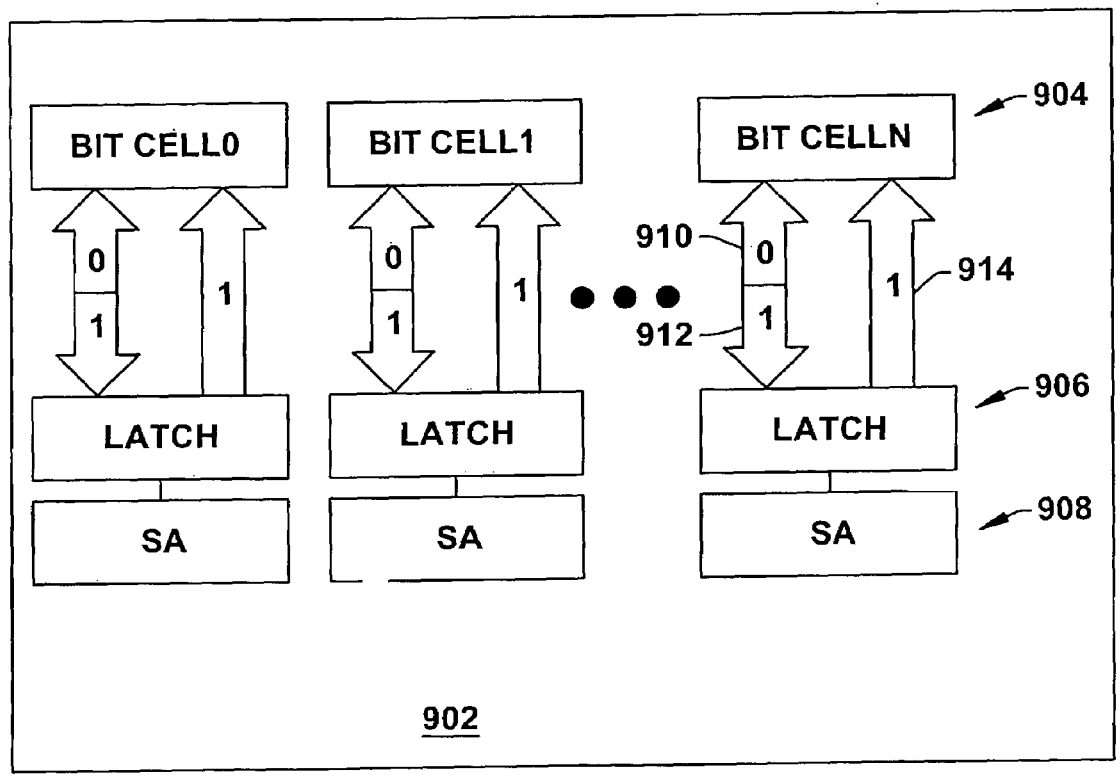
FIG. 9 is a block diagram illustrating a fatigue operation for a ferroelectric memory device in accordance with an aspect of the present invention.

FIG. 9 is a block diagram illustrating a fatigue operation for a ferroelectric memory device 900 in accordance with an aspect of the present invention. The memory device 900 includes a memory controller (not shown) that controls performing the fatigue operation. FIG. 9 is presented to illustrate the fatigue operation of the present invention at a high level. Further details of performing the fatigue operation are described and illustrated with respect to FIGS. 7 and 8.

The memory device 900 is illustrated with a group of memory cells 902 that are undergoing fatigue testing. The group 902 is a subsection of memory cells of the device 900 that can be tested in parallel and are sufficiently representative of all the memory cells of the device, with respect to number and location of individual cells of the group 902. Some examples of sufficient numbers that can be employed are 1024 memory cells and 2048 memory cells. Furthermore, the fatigue operation can be employed to simulate a lifetime of operation by performing it for a suitable number of cycles. As an example, 10E14 can be considered a suitable number of read/write cycles to represent 10 years of operative life.

The fatigue operation pre-stores "1" values into the group of memory cells 902. Then, a number of fatigue cycles are performed on the group of memory cells 902 wherein a cycle comprises simultaneously reading a "1" while writing a "0" and then writing back a "1", thereby requiring only two operations. More specifically, the fatigue cycle concurrently reads "1" values 912 from memory cells 904 into latches 906 of sense amps 908 while writing "0" values 910 into the memory cells. Then, the sense amps 908 write back "1" values 914 into the memory cells 904.

One conventional approach to fatiguing memory cells is using an external CPU to repeatedly write "1" and "0" values. However, each cycle is relatively long because data travels from the CPU and across a number of busses and the like, such as a general purpose input/output bus, local input/output bus, and through multiplexers, before reaching individual memory cells and associated ferroelectric capacitors. The distances traveled and required charge times reduce the speed of this approach. Additionally, a separate read operation needs to be performed at regular intervals to detect memory cell failure. The separate read operation requires even more time. Furthermore, the external CPU approach can only test a limited number of memory cells at a time. The external CPU approach is limited to fatiguing one memory word, which typically comprises only 8 to 64 memory cells.

Another conventional approach is to fatiguing memory cells is writing "1" and "0" values to a limited number of memory cells from a general input output latch present within a memory device. This approach avoids traveling across and charging some busses because of its relatively closeness to the memory cells being tested. However, the number of memory cells tested in parallel is still limited and is generally less than the number able to be tested in parallel by the present invention. Additionally, the general input output latch required for this approach consumes precious die area on the ferroelectric memory device.

It is appreciated that the above description references logical "0" and "1" values as being associated to particular charge values and/or charge states read from and maintained in ferroelectric capacitors. It is appreciated that charge states representing logical values "0" and "1" can be varied in accordance with the present invention. Furthermore, it is contemplated that an implementation using a first charge state to represent a "0" and a second charge state to represent a "1" and another implementation using the first charge state to represent a "1" and the second charge state to represent a "0" are contemplated and in accordance with the present invention. Additionally, the present invention has been described generally with memory cells that store and maintain single bits. However, it is appreciated that the present invention can also be employed with memory cells capable of storing more than a single bit.

The methodologies of the present invention are generally depicted and described as executing serially in order to facilitate understanding of the present invention. However, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fatiguing a ferroelectric memory device comprising:
    reading a first logical value from a group of memory cells;
    concurrent with reading the first logical value from the group of memory cells, writing a second logical value to the group of memory cells; and
    writing the first logical value back to the group of memory cells.

2. The method of claim 1, wherein the first logical value is "1" and the second logical value is "0".

3. The method of claim 1, wherein the group of memory cells comprises at least 64 memory cells.

4. The method of claim 1, wherein reading the first logical value comprises applying a read plate pulse to the group of memory cells to obtain data charges, altering a charge state of the group of memory cells as a result, transferring the data charges from the group of memory cells to latches of sense amplifiers, and deciphering logical values from the latched data charges.

5. The method of claim 4, wherein writing the second logical value comprises activating pull down circuits of the sense amplifiers that further alter the charge state of the group of memory cells resulting in writing the second logical value.

6. The method of claim 1, further comprising pre-storing a first logical value to the group of memory cells prior to reading the first logical value from the group of memory cells.

7. The method of claim 1, wherein the group of memory cells comprises at least 1024 ferroelectric memory cells.

8. The method of claim 1, selecting the group of memory cells from a plurality of ferroelectric memory cells of a ferroelectric memory device.

9. The method of claim 1, selecting the group of memory cells from a plurality of ferroelectric memory cells of a ferroelectric memory device according to physical locations in the ferroelectric memory device.

10. The method of claim 1, wherein the method is repeated a number of times to characterize a lifetime.

11. A method of fatiguing ferroelectric memory devices comprising:
    pre-charging one or more sense amplifiers and bit lines associated with a selected group of ferroelectric memory cells;
    maintaining one or more word lines as selected;
    applying a relatively long read pulse to plate nodes of the selected group and obtaining read data on the selected bit lines;
    latching the read data representing a first logical value into latches of the sense amplifiers and concurrently writing a weak second logical value to the selected group;
    activating sense amp pull down circuits of the sense amplifiers that drive the weak second logical value into a strong second logical value; and
    writing back the read data to the selected group of ferroelectric memory cells.

12. The method of claim 11, further comprising pre-storing a first logical value in the selected group of ferroelectric memory cells.

13. The method of claim 11, further comprising selecting the one or more word lines.

14. The method of claim 11, further comprising resetting the sense amplifiers and generating an end of cycle signal.

15. The method of claim 11, wherein the first logical value is a "1" and the second logical value is a "0".

16. A method of fatiguing ferroelectric memory cells comprising:
pre-charging bit lines associated with a group of cells;
activating one or more word lines associated with the group of cells;
activating a plate line signal associated with the group of cells and obtaining read data corresponding to a first logical state on the bit lines;
activating sense amplifiers associated with the bit lines to read the first logical state and latching the logical state in sense amplifier latches;
coupling the bit lines to a first voltage to write a second logical state in the selected group of cells; and
writing back the read first logical state from the sense amplifiers to the selected group of cells.

17. The method of claim 16, wherein activating the sense amplifiers includes activating pull-down circuits in the sense amplifiers.

18. The method of claim 17, wherein the activation of the pull-down circuits comprises latching the read data in the sense amplifier latches and coupling the bit lines to the first voltage.

19. The method of claim 16, wherein the first voltage is ground.

20. The method of claim 16, wherein pre-charging the bit lines includes pre charging the bit lines to the first voltage and floating the bit lines.

21. The method of claim 16, wherein activating the word lines comprises maintaining the word lines in activated states.

22. The method of claim 16, wherein activating the plate line signal comprises stepping a plate line voltage from low to high.

23. The method of claim 16, wherein writing back the read first logical state from the sense amplifiers to the selected group of cells includes de-activating the plate line signal.

24. The method of claim 16, wherein writing back the read first logical state from the sense amplifiers to the selected group of cells includes coupling the sense amplifier latches nodes to the bit lines.

25. The method of claim 16, wherein the bitlines are floated prior to activating the plate line signal.

26. The method of claim 16, wherein, the activation of the pull-down circuits comprises latching the read data in the sense amplifier latches.

27. The method of claim 16, wherein, the precharging the bitlines and coupling the bitlines to the first voltage comprises activating a bitline precharge signal applied to gates of transistors coupled between the bitlines and the first voltage source.

28. The method of claim 16, wherein, the coupling of the bitlines to the first voltage comprises activating a bitline precharge signal applied to gates of transistors coupled between the bitlines and the first voltage source.

29. The method of claim 16, wherein activating the plate line signal comprises applying a single plate pulse.

30. The method of claim 16, wherein activating the plate line signal comprises applying multiple plate pulses.

31. The method of claim 16, wherein the method is repeated a number of times to characterize a lifetime.

32. The method of claim 16, wherein the method is repeated at least 10E10 times.

33. The method of claim 16, further comprising pre-storing a first logical value to the group of memory cells prior to reading the first logical value from the group of memory cells.

34. The method of claim 16, wherein the group of memory cells comprises at least 1024 ferroelectric memory cells.

35. A ferroelectric memory device comprising:
a group of selected ferroelectric memory cells selected from memory cells of the device;
a group of sense amplifiers operative to read data from and write data to the group of ferroelectric memory cells; and
a memory controller coupled to the sense amplifier and the group of memory cells, wherein the memory controller performs a fatigue operation for a number of cycles that causes the group of sense amplifiers to read a first logical value from the group of ferroelectric memory cells while also writing a second logical value to the group of ferroelectric memory cells and then writing back the first logical value to the ferroelectric memory cells.

36. The memory device of claim 35, wherein the group of sense amplifiers comprise a cross coupled latch that latches read data and a pull down circuit operative to write data concurrent to latching the read data.

37. The memory device of claim 35, wherein the group of sense amplifiers comprise a cross coupled latch that latches read data and the device further comprises a pull down circuit operative to write data concurrent to latching the read data.

38. The memory device of claim 35, wherein the group of sense amplifiers comprise a latch that latches read data and the device further comprises a pull down circuit operative to write data after latching the read data.

39. The memory device of claim 35, wherein the group of sense amplifiers comprise a latch that latches read data and the device further comprises a pull down circuit operative to write data concurrently to latching the read data.

40. The memory device of claim 35, wherein the group of ferroelectric memory cells comprise 1024 ferroelectric memory cells.

41. The memory device of claim 35, wherein the group of ferroelectric memory cells comprise a column of ferroelectric memory cells.

42. The memory device of claim 35, wherein the first logical value is "1" and the second logical value is "0".

* * * * *